United States Patent
Pierson et al.

(10) Patent No.: US 6,252,779 B1
(45) Date of Patent: Jun. 26, 2001

(54) BALL GRID ARRAY VIA STRUCTURE

(75) Inventors: Mark Vincent Pierson, Binghamton; Michael Anthony Gaynes, Vestal, both of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/237,598

(22) Filed: Jan. 25, 1999

(51) Int. Cl.[7] .................................................. H05K 7/02
(52) U.S. Cl. ............................ 361/774; 29/840; 438/15; 428/131; 228/180.2
(58) Field of Search ................................ 361/739, 743, 361/746, 760, 807–810, 774; 228/180.2; 29/840; 438/15; 428/131; 174/250

(56) References Cited

U.S. PATENT DOCUMENTS

| | | |
|---|---|---|
| 4,967,314 | 10/1990 | Higgins, III . |
| 5,275,330 * | 1/1994 | Isaacs et al. ................. 228/180.2 |
| 5,337,219 | 8/1994 | Carr et al. . |
| 5,463,191 | 10/1995 | Bell et al. . |
| 5,482,736 | 1/1996 | Glenn et al. . |
| 5,487,218 | 1/1996 | Bhatt et al. . |
| 5,490,040 | 2/1996 | Gaudenzi et al. . |
| 5,493,075 | 2/1996 | Chong et al. . |
| 5,531,021 | 7/1996 | Kolman et al. . |
| 5,571,593 * | 11/1996 | Arldt et al. ..................... 428/131 |
| 5,591,941 | 1/1997 | Acocella et al. . |
| 5,615,477 * | 4/1997 | Sweitzer ............................ 29/840 |
| 5,658,827 | 8/1997 | Aulicino et al. . |
| 6,107,109 * | 8/2000 | Akram et al. ..................... 438/15 |

FOREIGN PATENT DOCUMENTS

| | | |
|---|---|---|
| 43 26 104 A1 | 8/1993 | (DE) . |
| 8-162767 | 6/1996 | (JP) . |

* cited by examiner

Primary Examiner—Jeffrey Gaffin
Assistant Examiner—Thanh Y. Tran
(74) Attorney, Agent, or Firm—Schmeiser, Olsen & Watts; John R. Pivnichny

(57) ABSTRACT

A method for joining electronic devices such as integrated circuits to vias in a substrate. A solder ball attached to an electronic device is joined to a contact pad of a via by a low melting temperature solder. An opening of a via is plugged to prevent wicking of the low melting temperature solder into the via hole. The opening of the via is plugged using a solder ball or a compressed length of a wire material.

30 Claims, 2 Drawing Sheets

BALL GRID ARRAY VIA STRUCTURE

FIELD OF THE INVENTION

The present invention is in the field of integrated circuits. More particularly, the present invention provides an improved method and apparatus for joining electronic devices to vias in a substrate.

BACKGROUND OF THE INVENTION

Electronic devices, such as integrated circuit chips, are commonly attached to a substrate (e.g., a printed circuit board (PCB) or printed circuit card (PCC)) with solder ball connecters using a ball grid array (BGA) connection technique. As known in the art, BGA generally involves the attachment of an array of solder balls located on the underside of an electronic device to a corresponding array of contact pads located on a surface of a substrate, using individual solder joints. Typically, each of the contact pads on the surface of the substrate is connected to a via that provides an electrically conductive path between the electronic device and wiring patterns located within internal layers of the substrate. The via may comprise, for example, a plated through hole (PTH), wherein the through hole extends through the thickness of the substrate and is lined with an electrically conductive material, or similar structure. A contact pad may be electrically connected to a via by a "dog-bone" or other type of connection, or may comprise a portion of the via itself. In the latter case, the contact pad or "via pad" generally extends above the top surface of the substrate directly above the via. The use of such "direct via" connections allows a designer to increase the density of electronic devices connected to a circuit board.

Typically, a low melting temperature eutectic solder paste, an electrically conductive adhesive, or other suitable material, is used to connect the solder balls on the electronic device to the via pads on the substrate. Unfortunately, a problem may occur when a solder ball connection is made to a via pad using a conventional "direct via" connection technique. Specifically, as the low melting temperature eutectic solder paste is heated and melts to form a connection between a solder ball and a via pad, the solder may be pulled down by a "wicking" action into the via away from the connection point. As a result of the wicking action, voids may form at the connection between the solder ball and the via pad, thereby causing increased electrical resistance. Further, the degraded connection between the solder ball and the via pad is more likely to fail over time due to thermal cycling. Additionally, water vapor or other gases or fluids may enter the via, causing corrosion of the conductive plating of the via or other damage to the via structure.

SUMMARY OF THE INVENTION

The present invention avoids the disadvantages of the prior art by providing a improved method and apparatus for joining an electronic device to a substrate. Although the present invention is primarily directed to the interconnection of electronic devices to a substrate using a ball grid array technique wherein a solder ball is connected to a via pad located directly over a via, it should be readily apparent that the present invention can be used with other interconnection methods without departing from the intended scope of the invention.

In accordance with the present invention, a high melting temperature solder ball (e.g., a 90/10 or 93/7 Pb/Sn alloy) is pressed, forced or otherwise inserted into the opening of a via to completely plug the via prior to the application of a layer of a low melting temperature eutectic solder paste (e.g., 63/37 Pb/Sn). Advantageously, by plugging the via in this manner, wicking of the low melting temperature eutectic solder paste into the via is prevented during subsequent processing steps.

After the via has been plugged, a low melting temperature eutectic solder paste is added to the via pad. Thereafter, a solder ball attached to an electronic device is placed on the low melting temperature eutectic solder paste, and the assembly is heated to reflow the low melting temperature eutectic solder paste, thereby connecting the solder ball attached to an electronic device to the via pad. The remaining, unfilled portion of the via may then be filled with an electrically conductive or insulating material to prevent fluids or gases from entering the via and corroding or otherwise damaging the conductive plating of the via.

In another embodiment of the present invention, a second high melting temperature solder ball can be pressed, forced or otherwise inserted into the second open end of the via. Plugging both ends of the via with solder balls prevents fluids or gases from entering the via and corroding or otherwise damaging the conductive plating of the via.

In another embodiment of the present invention, the via is initially filled with a soft conductive wire material, hereafter referred to as a "wire", that is coated with a low melting temperature solder material, such as a eutectic solder. For example, a tin coated (e.g., a 90/10 or 97/3 Pb/Sn wire may be used. The wire is inserted into the via and is severed such that the ends of the wire extend out of the via beyond the via pad and/or surface of the substrate. The wire is then compressed in length causing the wire to expand in diameter within the via. This causes the outside surface of the wire to compress against the inner conductive plating of the via, thus creating a tight mechanical bond between the wire and the via. The wire is compressed in length until the ends of the wire are substantially flush with the surface of the via pad on the substrate. The substrate may then be heated to reflow the coating of low temperature solder material on the wire to bond the wire to the conductive plating of the via. After the via hole has been plugged with the wire, a low melting temperature eutectic solder paste is added to the area on top of the via pad. Thereafter, a solder ball attached to an electronic device is placed on the low melting temperature eutectic solder paste, and the assembly is heated to reflow the low melting temperature eutectic solder, thereby connecting the solder ball to the via pad.

In an alternate embodiment of the above-described wire plugging technique, the via is filled with a soft conductive wire material that does not have a coating. When the wire is compressed in length, the diameter of the wire within the via increases, causing the outer surface of the wire to compress against the conductive sleeve of the via, thereby creating a tight mechanical bond between the wire and the via.

Generally, the present invention provides a method for forming an electrical connection, including the steps of:
- providing a substrate having a conductive opening therein;
- securely positioning a first electrically conductive member within the conductive opening to plug the conductive opening;
- positioning a quantity of a bonding material onto the first electrically conductive member;
- positioning a second electrically conductive member onto the bonding material; and
- heating the bonding material to bond the first and second electrically conductive members, thereby forming an electrical connection.

A further embodiment of the present invention provides a method for forming an electrical connection, including the steps of:

providing a substrate having a conductive opening therein;

inserting a length of an electrically conductive wire material into the conductive opening;

compressing opposing ends of the wire material to expand a diameter of the wire material within the conductive opening to plug the conductive opening;

positioning a quantity of a bonding material onto an end of the wire material;

positioning an electrically conductive member onto the bonding material; and heating the bonding material to bond the wire material to the electrically conductive member, thereby forming an electrical connection.

BRIEF DESCRIPTION OF THE DRAWINGS

The features of the present invention will best be understood from a detailed description of the invention and a preferred embodiment thereof selected for the purposes of illustration and shown in the accompanying drawings in which.

DETAILED DESCRIPTION OF THE INVENTION

Figure 1:
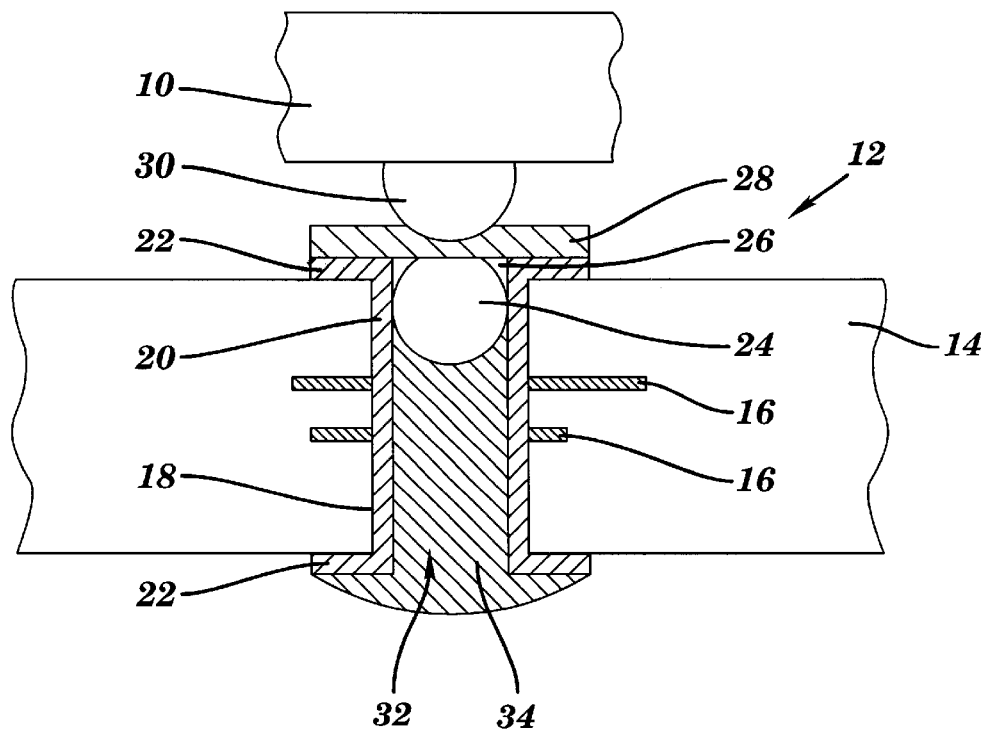
FIG. 1 is a cross-sectional view of an electrical connection between an electronic device and a substrate in accordance with a first embodiment of the present invention.

The features and advantages of the present invention are illustrated in detail in the accompanying drawings, wherein like reference numerals refer to like elements throughout the drawings.

A first embodiment of a method and apparatus for joining an electronic device 10 to a circuit board 12 using a ball grid array (BGA) connection technique is illustrated in FIG. 1. The circuit board 12 includes a substrate 14. Wiring patterns 16 may be located within internal layers of the substrate 14. A via 18 passes through the substrate 14. An electrically conductive plating 20 is formed on the interior surface of the via 18 in a manner known in the art. The conductive plating 20 is commonly formed of an electrically conductive material such as copper. As illustrated in FIG. 1, the conductive plating 20 contacts, and provides an electrical connection to, the wiring patterns 16 located within internal layers of the substrate 14. In addition, the ends of the conductive plating 20 extend out of the via 18 over a portion of the substrate 14 to form a via pad 22 on one or both of the external surfaces of the substrate 14.

In FIG. 1, in accordance with the present invention, a high melting temperature solder ball 24 is pressed into an opening 26 of the via 18, thereby completely sealing the opening 26. The high melting temperature solder ball is preferably composed of a 97/3 Pb/Sn alloy, although other suitable materials may be used. After the via 18 has been sealed by the solder ball 24, a quantity of a low melting temperature eutectic solder paste 28 is added over the solder ball 24 and the via pad 22. Thereafter, a solder ball 30 attached to the electronic device 10 is placed on the low melting temperature eutectic solder paste 28. The resultant assembly is heated to the reflow temperature (about 200° C.) of the low melting temperature eutectic solder paste 28. During reflow, the low melting temperature eutectic solder paste 28 fills the opening 26 of the via 18 above the solder ball 24, thereby connecting the solder ball 30 attached to the electronic device 10 to the via pad 22 and the solder ball 24. This forms an electrical connection between the solder ball 30, solder ball 24, and the via 18. Since the via 18 is sealed by the solder ball 24, the low melting temperature eutectic solder paste 28 is prevented from wicking into the open portion 32 of the via 18 below the solder ball 24. This produces a robust connection between the electronic device 10 and the via 18 that does not suffer from the disadvantages of the prior art. After the reflow step, the remaining open portion 32 of the via hole 18 is completely filled with an electrically conductive or insulating material 34 to further protect the via 18.

Figure 4:
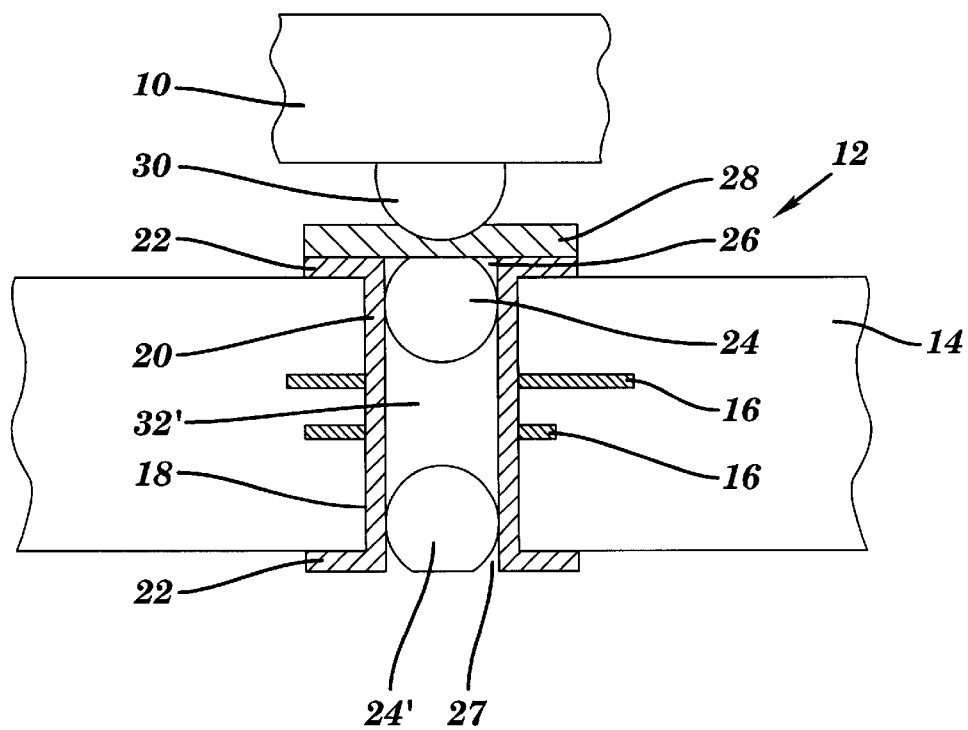
FIG. 4 illustrates a via plugged at both ends in accordance with another embodiment of the present invention.

Another embodiment of the present invention is shown in FIG. 4. A first high melting temperature solder ball 24 is pressed into a first opening 26 of the via 18, thereby sealing the opening 26. A second high melting temperature solder ball 24' is pressed into a second opening 27 of the via 18, thereby sealing the second opening 27. By sealing both openings 26 and 27 of the via 18, water vapor or other gases or fluids are prevented from entering the open portion 32' of the via 18, thereby preventing any corrosion or other damage to the conductive plating 20 of the via 18. Electronic devices 10 may be connected to the high temperature solder balls 24 and 24'.

Figure 2:
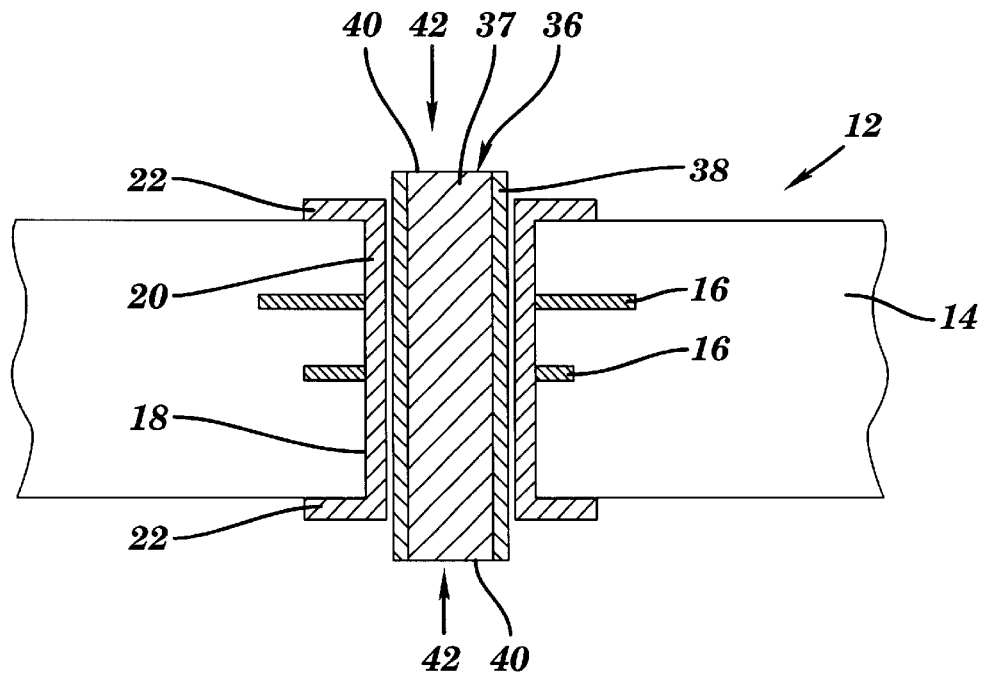
FIGS. 2 and 3 illustrate an electrical connection between an electronic device and a substrate in accordance with a second embodiment of the present invention.
Figure 3:
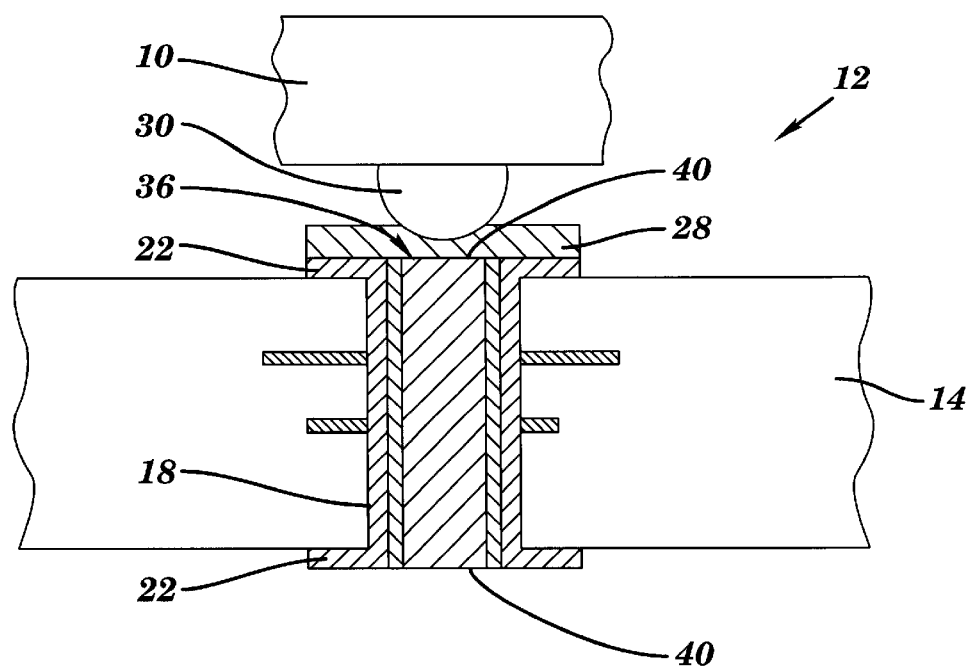

Another embodiment of the present invention is shown in FIGS. 2 and 3. A length of a wire 36, comprising an electrically conductive, deformable, material 37, coated with a low melting temperature coating 38 (e.g., a eutectic solder), is inserted into the via 18. The wire 36 is cut to length such that the ends 40 of the wire 36 protrude a predetermined distance beyond the via pads 22 on each side of the substrate 14. The ends 40 of the wire 36 are then compressed by a compressive force in opposing directions as indicated by directional arrows 42. The wire 36 is compressed in length until the ends 40 of the wire 36 lie in the substantially the same plane as the surface of the via pads 22, as is illustrated in FIG. 3. As the wire 36 is compressed in length, the diameter of the wire within the via 18 increases, causing the outer surface of the wire 36 to compress against the conductive sleeve 20 of the via 18, thereby creating a tight mechanical bond between the wire 36 and the via 18. As illustrated in FIG. 3, the wire 36 seals and completely fills the via 18, thereby preventing material from entering the via during subsequent processing steps. A secondary reflow may be performed to reflow the coating 38 on the wire 36 to the conductive plating 20 of the via 18.

In an alternate embodiment of the wire plugging technique, the wire 36 does not include the coating 38. In this case, as the wire 36 is compressed in length, the diameter of the wire within the via 18 increases, causing the outer surface of the wire 36 to compress against the conductive sleeve 20 or the via 18, thereby creating a tight mechanical bond between the wire 36 and the via 18.

After the via hole 18 is plugged with the wire 36, a low melting temperature eutectic solder paste 28 is positioned on an end 40 of the wire 36 and a corresponding via pad 22. Thereafter, a solder ball 30 attached to the electronic device 10 is placed on the low melting temperature eutectic solder paste 28. The resultant assembly is heated to the reflow temperature of the low melting temperature eutectic solder paste 28, thereby connecting the solder ball 30 attached to the electronic device 10 to the via pad 22 and the wire 36. This forms an electrical connection between the solder ball 30, wire 36, and the via 18. Since the via 18 is sealed and completely filled by the wire 36, the low melting temperature eutectic solder paste 28 is prevented from wicking into the via 18. Further, the via 18 is protected from gases and fluids that may be used during subsequent processing steps.

The foregoing description of the present invention has been presented for purposes of illustration and description. It is not intended to be exhaustive or to limit the invention to the precise form disclosed, and many modifications and variations are possible in light of the above teaching. Such modifications and variations that may be apparent to a person skilled in the art are intended to be included within the scope of this invention as defined by the accompanying claims.

We claim:

1. A method for forming an electrical connection, the method including:
   providing a substrate having a conductive opening therein;
   securely positioning a first electrically conductive member within the conductive opening to plug the conductive opening;
   positioning a quantity of a bonding material onto the first (electrically conductive member, wherein the bonding material has a melting temperature below a melting temperature of the first electrically conductive member;
   positioning a second electrically conductive member onto the bonding material; and
   heating the bonding material to bond the first and second electrically conductive members, thereby forming an electrical connection.

2. The method according to claim 1, wherein the first electrically conductive member comprises a solder ball.

3. The method according to claim 2, wherein securely positioning a first electrically conductive member within the conductive opening further includes:
   pressing the solder ball into the conductive opening.

4. The method according to claim 1, wherein the second electrically conductive member is a solder ball attached to an electronic device.

5. The method according to claim 1, wherein the conductive opening comprises a via.

6. The method according to claim 5, wherein the via is plated with an electrically conductive material.

7. The method according to claim 1, wherein the first electrically conductive member prevents the bonding material from entering the conductive opening during the heating step.

8. The method according to claim 1, wherein the bonding material comprises a low melting temperature eutectic solder.

9. The method according to claim 1, wherein after formation of the electrical connection, the method further includes:
   completely filling any unfilled portions of the conductive opening with a material.

10. The method according to claim 1, wherein the bonding material is additionally positioned on a contact pad of the conductive opening, and wherein, during the heating step, the bonding material bonds the first and second electrically conductive members and the contact pad together to form the electrical connection.

11. The method according to claim 1, wherein the first electrically conductive member comprises a length of a wire material.

12. The method according to claim 11, wherein the wire material completely fills the conductive opening.

13. The method according to claim 11, wherein the wire material is surrounded by a layer of a coating material.

14. The method according to claim 13, further including:
   heating the coating material to bond the wire material to the conductive opening.

15. The method according to claim 11, wherein securely positioning the wire material within the conductive opening to plug the conductive opening further includes:
   compressing opposing ends of the wire material to expand a diameter of the wire material within the conductive opening, thereby plugging the conductive opening.

16. The method according to claim 15, wherein the conductive opening further includes a contact pad, and wherein the wire material is compressed until one of the opposing ends of the wire material lies in substantially the same plane as the contact pad of the conductive opening.

17. A method for forming an electrical connection, the method including:
   providing a substrate having a conductive opening therein;
   plugging the conductive opening by securely positioning a length of a wire material within the conductive opening;
   positioning a quantity of a bonding material onto an end of the wire material;
   positioning a second electrically conductive member onto the bonding material; and
   heating the bonding material to bond the wire material to the second electrically conductive member, thereby forming an electrical connection.

18. The method according to claim 17, wherein the wire material completely fills the conductive opening.

19. The method according to claim 17, wherein the wire material is surrounded by a layer of a coating material.

20. The method according to claim 19, further including:
   heating the coating material to bond the wire material to the conductive opening.

21. The method according to claim 17, wherein plugging the conductive opening further includes:
   compressing opposing ends of the wire material to expand a diameter of the wire material within the conductive opening, thereby plugging the conductive opening.

22. The method according to claim 21, wherein the conductive opening further includes a contact pad, and wherein the wire material is compressed until one of the opposing ends of the wire material lies in substantially the same plane as the contact pad of the conductive opening.

23. The method according to claim 17, wherein the second electrically conductive member is a solder ball attached to an electronic device.

24. An electrical connection, comprising:
   a solder ball attached to an electrical device;
   a substrate having an conductive opening therein,
   a contact pad on the substrate, wherein the contact pad is connected to the conductive opening;
   a solder ball securely positioned within the conductive opening to plug the conductive opening; and
   a layer of a bonding material for electrically connecting the contact pad, the solder ball positioned within the conductive opening, and the solder ball of the electrical device.

25. The electrical connection according to claim 24, further including:

a filler material for completely filling any unfilled portions of the conductive opening.

26. The electrical connection according to claim 24, wherein the conductive opening comprises a via plated with an electrically conductive material.

27. An integrated circuit assembly comprising:

an integrated circuit;

a solder ball attached to the integrated circuit;

a substrate having an conductive opening therein, a contact pad on the substrate, wherein the contact pad is connected to the conductive opening;

a plug member, having a first melting temperature, securely positioned within the conductive opening to plug the conductive opening; and a layer of a bonding material, having a second melting temperature lower than the first melting temperature, for electrically connecting the contact pad, the plug member, and the solder ball of the integrated circuit.

28. The assembly according to claim 27, wherein the plug member comprises a solder ball.

29. The assembly according to claim 27, wherein the plug member comprises a length of wire material.

30. A method for forming an electrical connection, the method including:

providing a substrate having a conductive through hole;

securely positioning a first electrically conductive member within a first opening of the through hole;

securely positioning a second electrically conductive member within a second opening of the through hole;

providing a quantity of bonding material, having a lower melting temperature than a melting temperature of the first and second electrically conductive members, over at least one of the first and second electrically conductive members; and bonding a solder ball attached to an electrical device to the bonding material.

* * * * *